(12) United States Patent
Weaver et al.

(10) Patent No.: US 10,900,766 B2
(45) Date of Patent: *Jan. 26, 2021

(54) INTEGRATED PASSIVE CIRCUIT ELEMENTS FOR SENSING DEVICES

(71) Applicant: 3M INNOVATIVE PROPERTIES COMPANY, St. Paul, MN (US)

(72) Inventors: Billy L. Weaver, Eagan, MN (US); Matthew H. Frey, Cottage Grove, MN (US); Lijun Zu, Woodbury, MN (US); Cristin E. Moran, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 536 days.

This patent is subject to a terminal disclaimer.

(21) Appl. No.: 14/569,943

(22) Filed: Dec. 15, 2014

(65) Prior Publication Data

US 2015/0097587 A1 Apr. 9, 2015

Related U.S. Application Data

(62) Division of application No. 12/767,884, filed on Apr. 27, 2010, now Pat. No. 8,941,395.

(51) Int. Cl.
| | | |
|---|---|---|
| G01B 7/00 | (2006.01) | |
| G06F 3/041 | (2006.01) | |
| C23F 1/02 | (2006.01) | |
| C23F 1/14 | (2006.01) | |
| G06F 3/044 | (2006.01) | |
| G01R 27/26 | (2006.01) | |
| H03K 17/96 | (2006.01) | |

(52) U.S. Cl.
CPC ............... *G01B 7/003* (2013.01); *C23F 1/02* (2013.01); *C23F 1/14* (2013.01); *G01R 27/2605* (2013.01); *G06F 3/044* (2013.01); *G06F 3/0418* (2013.01); *G06F 2203/04107* (2013.01); *G06F 2203/04112* (2013.01); *H03K 2017/9602* (2013.01); *Y10T 29/49124* (2015.01)

(58) Field of Classification Search
None
See application file for complete search history.

(56) References Cited

U.S. PATENT DOCUMENTS

| | | |
|---|---|---|
| 4,720,607 A | 1/1988 | de Moncuit |
| 5,126,007 A | 6/1992 | Shmulovich |
| 5,492,611 A | 2/1996 | Sugama et al. |

(Continued)

FOREIGN PATENT DOCUMENTS

| | | |
|---|---|---|
| CN | 101576671 | 11/2009 |
| TW | 201011620 | 3/2010 |

(Continued)

*Primary Examiner* — Paresh Patel
(74) *Attorney, Agent, or Firm* — Jonathan L. Tolstedt

(57) ABSTRACT

Capacitive sensing devices are provided that include a sensing pattern of conductive traces disposed upon the surface of a substrate and a first passive circuit element that includes a metallic conductor disposed upon the same surface of the substrate. In some embodiments, the first passive circuit element is a component of an electronic circuit that can be, for example, a low pass filter. Provided capacitive sensing devices are useful, for example, when incorporated into projected touch screen display panels for use on electronic devices.

15 Claims, 4 Drawing Sheets

(56) References Cited

U.S. PATENT DOCUMENTS

| | | | |
|---|---|---|---|
| 5,512,131 A | 4/1996 | Kumar et al. | |
| 5,801,340 A | 9/1998 | Peter | |
| 5,841,078 A | 11/1998 | Miller et al. | |
| 6,147,724 A * | 11/2000 | Yoshii | G02B 6/0083 349/62 |
| 6,156,424 A | 12/2000 | Taylor | |
| 6,448,873 B1 * | 9/2002 | Mostov | H01F 17/0006 333/184 |
| 6,492,979 B1 | 12/2002 | Kent et al. | |
| 6,775,907 B1 | 8/2004 | Boyko et al. | |
| 7,298,084 B2 | 11/2007 | Baude et al. | |
| 7,524,528 B2 * | 4/2009 | Kodas | C09D 11/30 29/620 |
| 7,578,195 B2 | 8/2009 | DeAngelis et al. | |
| 7,825,905 B2 | 11/2010 | Philipp | |
| 8,063,886 B2 | 11/2011 | Serban et al. | |
| 8,077,154 B2 | 12/2011 | Emig et al. | |
| 8,274,494 B2 | 9/2012 | Frey et al. | |
| 8,319,737 B2 | 11/2012 | Noguchi et al. | |
| 8,384,491 B2 | 2/2013 | Hsieh et al. | |
| 8,384,691 B2 | 2/2013 | Frey et al. | |
| 8,400,408 B2 * | 3/2013 | Hotelling | C12N 15/86 345/173 |
| 8,508,680 B2 | 8/2013 | Geaghan et al. | |
| 8,786,557 B2 | 7/2014 | Noguchi et al. | |
| 2002/0130605 A1 * | 9/2002 | Mueller | B82Y 10/00 313/310 |
| 2003/0009855 A1 | 1/2003 | Budzynski | |
| 2005/0005703 A1 | 1/2005 | Saito et al. | |
| 2007/0096849 A1 * | 5/2007 | Inoue | H01L 23/552 333/181 |
| 2007/0160811 A1 | 7/2007 | Gaides et al. | |
| 2007/0279395 A1 * | 12/2007 | Philipp | G01R 27/2605 345/173 |
| 2008/0309623 A1 | 12/2008 | Hotelling et al. | |
| 2009/0073135 A1 | 3/2009 | Lin et al. | |
| 2009/0107737 A1 * | 4/2009 | Reynolds | G06F 3/0202 178/18.06 |
| 2009/0218310 A1 | 9/2009 | Zu et al. | |
| 2009/0219257 A1 | 9/2009 | Frey et al. | |
| 2009/0284494 A1 | 11/2009 | Hung et al. | |
| 2010/0091473 A1 | 4/2010 | Kiwitt et al. | |
| 2010/0156840 A1 | 6/2010 | Frey et al. | |
| 2010/0272786 A1 | 10/2010 | Cohen et al. | |

FOREIGN PATENT DOCUMENTS

| | | | |
|---|---|---|---|
| WO | WO 2005107313 A2 * | 11/2005 | H04Q 9/00 |
| WO | WO 2009/108765 | 9/2009 | |
| WO | WO 2009/154812 | 12/2009 | |
| WO | WO 2010/002519 | 1/2010 | |
| WO | WO 2010/002679 | 1/2010 | |

* cited by examiner

INTEGRATED PASSIVE CIRCUIT ELEMENTS FOR SENSING DEVICES

FIELD

Sensing devices are provided which can be useful in touch screen displays.

BACKGROUND

Touch screen sensors can detect the location of an object (e.g. a finger or a stylus) applied to the surface of a touch screen display or the location of an object positioned near the surface of a touch screen display. These sensors can detect the location of the object along the surface of the display, e.g. in the plane of a flat rectangular display. Examples of touch screen sensors include capacitive sensors, resistive sensors, and projected capacitive sensors. Such sensors can include transparent conductive elements that overlay the display. The elements can be combined with electronic components that use electrical signals to probe the elements in order to determine the location of an object near or in contact with the display.

Touch screen sensors are useful in electronic devices such as, for example, mobile phones, personal digital assistances (PDAs), laptop computers, and as an interface to computer systems. Recently projected capacitive touch sensor technology has been developed that allows users to interact with the touch sensor with more than one finger. The capacitance change at every individual point on, for example a sensor grid, can be measured to accurately determine the touch location or locations of one or more fingers. But projected capacitive touch sensors rely on very small changes in capacitance in the sensor. The sensitivity of projected capacitive touch sensors can be affected by stray electromagnetic radiation (e.g., electromagnetic interference, EMI) from, for example, a display device near the sensor or from electromagnetic radiation from outside the device.

Thus, there is a need for projective capacitive sensors that are highly responsive to input from a user but can resist interference from stray electric fields. There is a need for projective capacitive sensors that are very compact, transparent, and can be used in a large variety of environments. Finally, there is a need for projective capacitive sensors that are economical with regards to price, manufacturing process, and electronic real estate.

SUMMARY

One approach to building resilience (e.g., EMI tolerance) into capacitive sensors, especially projected capacitive touch sensors (e.g., touch screen sensors), is to integrate passive circuit elements with the capacitive sensor. By integration with capacitive sensors, what is meant is that the passive circuit elements are supported on the same substrate as the capacitive sensing elements. The integrated passive circuit elements can serve one or more purposes, as described below. Typically the passive circuit elements can be integrated onto the sensor substrate in order to minimize the population of discrete circuit elements on any associated flexible circuitry or printed circuit board packaging. The associated flexible circuitry or printed circuit board packaging can be combined with a capacitive sensor to construct a capacitive touch-sensing system. The integration of passive circuit elements, as described herein, can be particularly useful for projected capacitive touch sensors, for example multi-touch projected capacitive sensors based on the measurement of mutual capacitance between adjacent conductive sensing elements (e.g., conductive sensing elements that exist on separate layers, for example, substrates of laminated stack; or conductive sensing elements that exist on opposing sides of, for example, a single insulating substrate in a laminated stack).

In one aspect, a capacitive sensor is provided that includes a substrate having a surface, a sensing pattern of conductive traces disposed upon the surface of the substrate, and a first passive circuit element comprising a metallic conductor disposed upon the same surface of the substrate. The substrate can be transparent to visible light and can be polymeric. The sensing pattern of conductive traces and the first passive circuit element can include the same conductive material. The passive circuit element can be a resistor, a capacitor, or an inductor. The sensor can have additional circuit elements that can be arranged to form electronic circuits such as, for example, a low-pass filter, a high-pass-filter, or a band-pass filter. All of the aforementioned passive circuit elements can be free of any transparent conducting metal oxide (TCO; for example indium tin oxide, ITO) or transparent conducting polymers.

In another aspect, a method of making a capacitive sensor is provided that includes providing a substrate comprising a metal coating disposed thereon, and etching the metal to form a sensing pattern of conductive metal traces disposed upon the substrate; and at least one passive circuit element comprising a metallic conductor disposed upon the same surface of the substrate. The method can further include contacting the raised features of an inked stamp to the metal coating before the etching step. The inked stamp can include a self-assembled monolayer-forming molecule.

In This Disclosure:

"adjacent" refers to layers which are in proximity with one another—having three or less layers between them;

"electrically-conducting" refers to materials having a bulk electrical resistivity between about $10^{-6}$ to 1 ohm-cm;

"integrate" or "integration" refers to placing or having a passive circuit element or a capacitive sensing element directly disposed upon the surface of a substrate; an integrated passive circuit element is in contrast to a discrete passive circuit element, for example a chip resistor or chip capacitor that must be bonded to a substrate and electrically connected to a substrate (for example solder-bonded or wire-bonded);

"passive circuit element" refers to an element of an electrical circuit that does not contain a semiconducting material as part of its construction;

"mesh" refers to a two-dimensional network of conductive traces, for example traces that run orthogonal to each other to yield a rectangular (e.g., square) grid;

"conductive trace" refers to a narrow, linear pattern element in a pattern of conductive material; for example a conductive line of width 2 micrometers that is 100 micrometers in length;

"touch sensor or sensing" or "touch screen" refer to sensor elements that can be activated by physical or proximal touching (indirect—disturbing the electric field) with one or more body parts (i.e., one or more fingers); and "non-conductive" and "insulating" are used interchangeably, and the terms refer to materials that are substantially not electrically-conducting, for example materials that have a bulk electrical resistivity of at least $10^6$ ohm-cm, preferably at least $10^8$ ohm-cm, more preferably at least $10^{12}$ ohm-cm;

The provided capacitive sensor and methods disclosed herein can be used to assemble projective capacitive sensors that are highly responsive to input from a user but that can resist interference from stray electric fields (e.g., fields that are imposed by EMI). The projective capacitive sensors according to this disclosure can resist interference from any electronic device of which they are a part. For example, a touch screen according to this disclosure can resist interference when included as part of a mobile phone or personal digital assistant device. The provided method and capacitive sensors made thereby can be very compact, transparent and can be used in a large variety of electromagnetic environments. The method is very economical with regards to price and process.

The above summary is not intended to describe each disclosed embodiment of every implementation of the present invention. The brief description of the drawings and the detailed description which follows more particularly exemplify illustrative embodiments.

BRIEF DESCRIPTION OF THE DRAWINGS

FIG. 3b is an exploded view of a portion of FIG. 3a.

DETAILED DESCRIPTION

Figure 1:
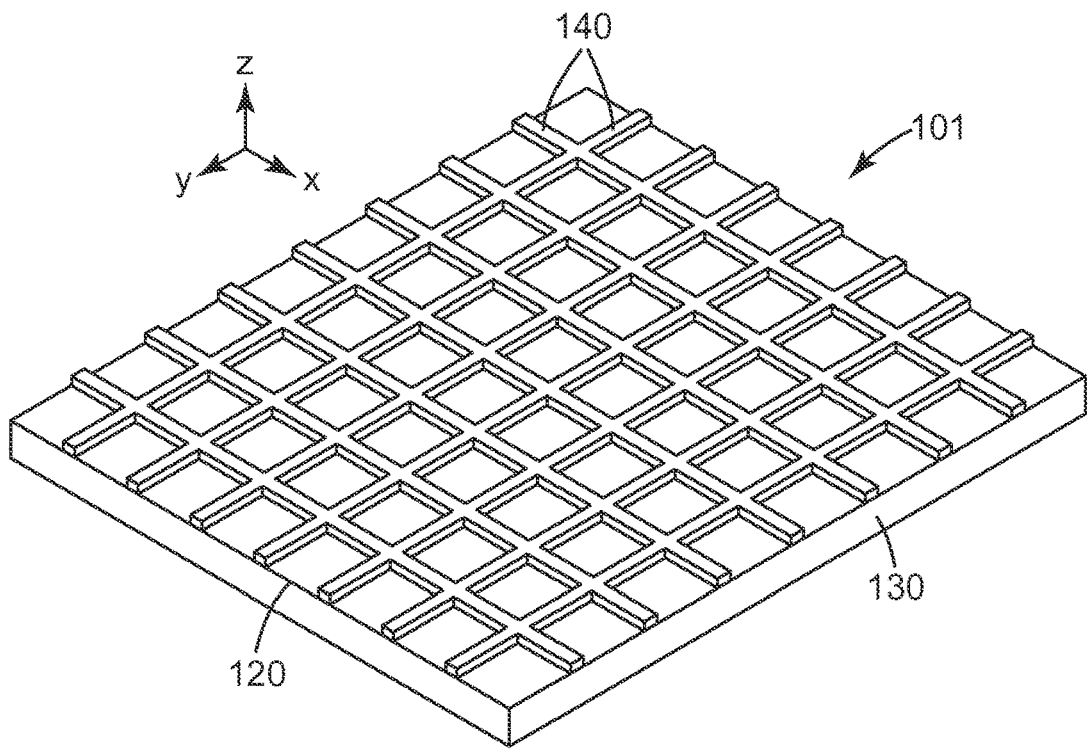
FIG. 1 illustrates a perspective view of a conductive visible light transparent region lying within a touch screen sensing area.

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Capacitive sensors are provided that include integration of passive circuit elements on, for example, substrates that include transparent or invisible capacitive sensing elements useful for touch displays provided thereon. The provided capacitive sensors can include contact sensors and proximity sensors, such as those that use projected capacitive touch (PCTT) technology. Capacitive sensors with higher accuracy and sensitivity utilize projected capacitive touch technology. Projected capacitive touch technology is a capacitive technology that permits more accurate and flexible operation than standard contact or capacitive sensor technology. Typically a projected capacitive touch sensor can be made by patterning one or more conductive layers. For example, a projected capacitive touch screen sensor in the form of an XY array sensor (or matrix sensor) can be created by forming isolated transparent conductive bars on separate substrates and laminating two substrates with bars on respective layers oriented orthogonally. Overlapping bars on the respective laminated layers would be electrically isolated from each other by insulating material. Alternatively, an XY array sensor can be created by forming isolated transparent conductive bars on opposite sides of the same insulating substrate, the bars on one side of the substrate being oriented orthogonally to the bars on the other. In yet a third embodiment, and XY array sensor can be created by patterning transparent conductive material on one surface of an insulating substrate in the following configuration: first bars (e.g., parallel) of transparent conductive material are created in a first direction on an insulating substrate; insulating material (e.g., printed dielectric or photolithographically defined dielectric) is deposited over the transparent conductive material of the first bars in at least the regions where second bars created in a second direction will cross the first bars; second bars of transparent conductive material are created in a second direction, for example the direction orthogonal to the first bars, wherein the second bars overlap the first bars in regions where the first bars are insulating material is deposited. As is known in the art, for any of the aforementioned XY array sensors, the bars may include pad regions, for example diamond-shaped or square shaped pads, along the bars.

Transparent conductive bars may include bars that comprise conductive traces (e.g., metallic traces) in the form of a mesh. Conductive traces in the form of a mesh may be formed by etch patterning a first layer of conductive material (e.g., metal), next forming insulating deposits, and next forming conductive bridges over the insulating deposit or deposits, to form a grid pattern of electrodes as described in the third XY array embodiment above. Alternatively, conductive traces in the form of a mesh may be formed by printing a first pattern of conductive material (e.g., metal) on an insulating substrate, next forming insulating deposits, and next forming conductive bridges over the insulating deposit or deposits, to form a grid pattern of electrodes as described in the third XY array embodiment above. Alternatively, an XY array sensor may be formed by etch patterning two separate, perpendicular layers of conductive material with parallel bars (alternatively called lines or tracks) to form the grid. Projected capacitive touch sensors are disclosed, for example, in U.S. Pat. Publ. Nos. 2009/0073135 (Lin et al.), 2009/0219257 (Frey et al.), and PCT Publ. No. WO 2009/154812 (Frey et al.).

The XY array sensors described above constitute a grid of capacitors, wherein each capacitor results from each intersection between one of the first bars and one of the second bars. Voltage can be applied between such a pair of electrically isolated bars, resulting in the accumulation of stored charge according to the capacitance between said bars (mutual capacitance or trans-capacitance), said charge (and its associated electric field) being largely isolated to a region proximate to the point of intersection. Bringing a finger or conductive stylus close to the surface of the sensor changes the local electrostatic field. The capacitance change at every individual point on the grid can be measured to accurately determine the touch location. The use of a grid permits the location of more than one finger sometimes referred to as multi-touch operation. The proximity method of operation allows operation without direct contact, such that the conducting layers can be coated with further protective insulating layers, and operates even under screen protectors, or behind weather and vandal-proof glass.

The provided concepts of passive circuit element integration onto a substrate of a touch sensor (e.g., a touch screen sensor) are not limited with respect to the capacitive sensor design or configuration (i.e., not limited to sensors of an XY array design or configuration). Similar benefits of passive circuit element integration onto a substrate of a touch sensor can result for touch sensors of other designs, for example designs based on mutual capacitance where capacitors are formed from adjacent but isolated conductive elements in the same plane on a substrate surface. Preferred touch detection sensors (e.g., touch screen sensors) incorporating the integrated passive circuit elements are XY array design sensors.

The presently disclosed concepts of passive circuit element integration onto a substrate of a touch sensor (e.g., a touch screen sensor) are not limited in any way with respect to the origin of capacitance that is being measured (i.e., not limited to mutual capacitance measuring sensor systems). Similar benefits of passive circuit element integration onto a substrate of a touch sensor would result for sensor systems wherein measurements of self-capacitance (or capacitance-to-ground) are made. Such sensor systems may include sensors of an XY array design. Alternatively, such sensor systems may include a sensor of a design comprising an array of capacitive pads that may exist in one plane and that are individually addressable by the self-capacitance measurement electronics. Typical touch detection systems sensors (e.g., touch screen sensor systems) that include a sensor that incorporates the integrated passive circuit elements are systems that measure changes in mutual capacitance. Systems that measure changes in mutual capacitance and systems that measure changes in self-capacitance include those described, for example, in U.S. Pat. No. 5,841,078 (Miller et al.).

As already described, a primary benefit of the integration of passive circuit elements onto the same substrate as touch-sensing elements of a capacitive touch sensor, for example in the form of a filtering circuit, is the reduction of the susceptibility of the capacitive touch sensor and its associated controller electronics to be compromised or diminished in sensing performance by electromagnetic interference (EMI). A common source of interference for a touch sensor is a display with which the sensor is combined. Accordingly, it is common in the touch display field for a shielding layer of transparent conductive material (e.g., indium tin oxide supported on a transparent substrate) to be placed between the display and the touch sensor. One advantage of the currently described capacitive sensors is that they can allow for combination of the sensor and a display without the need for an EMI shield.

The provided capacitive sensors can have electrical and optical properties that are engineered through design of conductive traces comprised thereon. The provided sensors include a substrate that has a surface. A sensing pattern of conductive traces is disposed adjacent to the surface of the substrate. The substrate can be a transparent substrate, such as glass, polymer, ceramic, or any other substrate that is visibly light transparent. As used herein, "visible light transparent" refers to the level of transmission being at least 60 percent transmissive to at least one polarization state of visible light, where the percent transmission is normalized to the intensity of the incident, optionally polarized light. It is within the meaning of visible light transparent for an article that transmits at least 60 percent of incident light to include microscopic features (e.g., dots, squares, or lines with minimum dimension, e.g. width, between 0.5 and 10 micrometers, or between 1 and 5 micrometers) that block light locally to less than 80 percent transmission (e.g., 0 percent); however, in such cases, for an approximately equiaxed area including the microscopic feature and measuring 1000 times the minimum dimension of the microscopic feature in width, the average transmittance is greater than 60 percent.

Alternatively, for some applications, the substrate can be opaque in some regions of the visible light spectrum. The only requirement for the substrate is that it has a surface capable of supporting a sensing pattern of conductive traces. As such, it can itself, be non-conductive and it should have a surface upon which conductive traces can be located. In some embodiments, one to three additional layers may be imposed between the substrate and the pattern of conductive traces. For example, a passivation layer that smoothes out the surface of the substrate can be present between the substrate and the pattern of conductive traces. In these cases, the substrate may or may not be conductive, but the layer upon which the pattern of conductive traces is directly disposed needs to be non-conductive.

The sensing pattern of conductive traces which is disposed adjacent to the surface of the substrate can include micropatterns that can, optionally, be transparent. The visible light transparent conductor micropatterns can be particularly useful for projected capacitive touch screen sensors that are combined with electronic displays. As a component of projected capacitive touch screen sensors, the visible light transparent conductive micropatterns can be useful for enabling high touch sensitivity, multi-touch detection, and stylus input.

FIG. 1 illustrates a perspective view of a conductive visible light transparent region 101 that lies within touch-sensing area 105 of a touch screen panel. Conductive visible light transparent region 101 includes visible light transparent substrate 130 having surface 120 and sensing pattern of conductive traces 140 disposed on or in visible light transparent substrate 130. Sensing pattern of conductive traces 140 is disposed upon substrate 130. Visible light transparent substrate 130 includes 132 and is electrically insulating. Visible light transparent substrate 130 can be formed of any useful electrically-insulating material such as, e.g., glass or polymer. Examples of useful polymers for light transparent substrate 130 include polyethylene terephthalate (PET), polyethylene naphthalene (PEN), and polyimide (PI). Electrically-conductive pattern 140 can be formed of a plurality of linear metallic features. In some embodiments, conductive visible light transparent region 101 that lies within a touch-sensing area of a touch screen panel includes two or more layers of visible light transparent substrate 130 each having a pattern of conductive traces 140.

Sensing pattern of conductive traces 140 is deposited on surface 120 of substrate 130. In the embodiments illustrated in FIG. 1, the sensor is to be interfaced with a display to form a touch screen display, or touch panel display, substrate 130 is visible light transparent and substantially planar. The substrate and the sensor may be substantially planar and flexible. By visible light transparent, what is meant is that information (e.g., text, images, or figures) that is rendered by the display can be viewed through the touch sensor. The viewability and transparency can be achieved for touch sensors including conductors in the form of a deposited metal, even metal that is deposited with thickness great enough to block light, if the metal is deposited in an appropriate micropattern.

Conductive micropattern 140 includes at least one visible light transparent conductive region overlaying a viewable portion of the display that renders information. By visible light transparent conductive, what is meant is that the portion of the display can be viewed through the region of conductive micropattern and that the region of micropattern is electrically conductive in the plane of the pattern, or stated differently, along the major surface of the substrate onto which the conductive micropattern is deposited and to which it is adjacent. Typical conductive micropatterns include regions with two dimensional meshes, e.g. square grids, rectangular (non-square) grids, or regular hexagonal networks, where conductive traces define enclosed open areas within the mesh that are not deposited with conductor that is in electrical contact with the traces of the mesh. The open spaces and associated conductive traces at their edges are referred to herein as cells. Other useful geometries for mesh cells include random cell shapes and irregular polygons. In some embodiments, the conductive visible light transparent region that can lie within a touch-sensing area of a touch screen panel can include two or more layers of visible light transparent substrate each having a conductive micropattern.

In some embodiments, the conductive traces defining the sensing pattern can be designed not to include segments that are approximately straight for a distance greater than the combined edge length of five adjacent cells, typically four adjacent cells, three adjacent cells, or even two adjacent cells. Generally, the traces defining the micropattern can be designed not to include segments that are straight for a distance greater than the edge length of a single cell. Accordingly, in some embodiments, the traces that define the micropattern are not straight over long distances, e.g., 10 centimeters, 1 centimeter, or even 1 millimeter. Patterns with minimal lengths of straight line segments, as just described, can be particularly useful for touch screen sensors with the advantage of causing minimal disturbance of display viewability.

The two-dimensional geometry of the sensing pattern of conductive traces (that is, geometry of the pattern in the plane or along the major surface of the substrate) can be designed, with consideration of the optical and electrical properties of the conductor material, to achieve special transparent conductive properties that are useful in touch screen sensors. For example, whereas a continuous (unpatterned) deposit or coating of conductor material has a sheet resistance that is calculated as its bulk resistivity divided by its thickness, in the provided sensors, different levels of sheet resistance can be engineered by micropatterning the conductor as well.

In some embodiments, the two-dimensional sensing pattern of conductive traces can be designed to achieve anisotropic sheet resistance in a conductive region (e.g., a visible light transparent conductive region) of the sensor. By anisotropic sheet resistance, what is meant is that the magnitude of the sheet resistance of the sensing pattern of conductive traces is different when measured or modeled along two orthogonal directions. In other embodiments, the two-dimensional pattern of conductive traces can be designed to achieve isotropic sheet resistance in a conductive region (e.g., a visible light transparent conductive region) of the sensor. By isotropic sheet resistance, what is meant is that the magnitude of the sheet resistance of the pattern of conductive traces is substantially the same when measured or modeled along any two orthogonal directions in the plane, as in the case for a square grid formed with traces of constant width for both directions.

Appropriate micropatterns of conductor for achieving transparency of the sensor and viewability of a display through the sensor can have certain attributes. First of all, regions of the conductive micropattern through which the display is to be viewed can have an area fraction of the sensor that is shadowed by the conductor of less than 50%, or less than 25%, or less than 20%, or less than 10%, or less than 5%, or less than 4%, or less than 3%, or less than 2%, or less than 1%, or in a range from 0.25 to 0.75%, or less than 0.5%.

The open area fraction (or open area or Percentage of Open Area) of a conductive micropattern, or region of a conductive micropattern, is the proportion of the micropattern area or region area that is not shadowed by the conductor. The open area is equal to one minus the area fraction that is shadowed by the conductor, and may be expressed conveniently, and interchangeably, as a decimal or a percentage. Area fraction that is shadowed by conductor is used interchangeably with the density of lines for a micropatterned conductor. Micropatterned conductor is used interchangeably with electrically conductive micropattern and conductive micropattern. Thus, for the values given in the above paragraph for the fraction shadowed by conductor, the open area values are greater than 50%, greater than 75%, greater than 80%, greater than 90%, greater than 95%, greater than 96%, greater than 97%, greater than 98%, greater than 99%, 99.25 to 99.75%, 99.8%, 99.85%, 99.9% and even 99.95. In some embodiments, the open area of a region of the conductor micropattern (e.g., a visible light transparent conductive region) is between 80% and 99.5%, in other embodiments between 90% and 99.5%, in other embodiments between 95% and 99%, in other embodiments between 96% and 99.5%, in other embodiments between 97% and 98%, and in other embodiments up to 99.95%. With respect to the reproducible achievement of useful optical properties (e.g. high transmission and invisibility of conductive pattern elements) and electrical properties, using practical manufacturing methods, typical values of open area are between 90 and 99.5%, between 95 and 99.5%, or even between 95 and 99.95%.

To minimize interference with the pixel pattern of the display and to avoid viewability of the pattern elements (e.g., conductor lines) by the naked eye of a user or viewer, the minimum dimension of the conductive pattern elements (e.g., the width of a line or conductive trace) can be less than or equal to approximately 50 micrometers, or less than or equal to approximately 25 micrometers, or less than or equal to approximately 10 micrometers, or less than or equal to approximately 5 micrometers, or less than or equal to approximately 4 micrometers, or less than or equal to approximately 3 micrometers, or less than or equal to approximately 2 micrometers, or less than or equal to approximately 1 micrometer, or less than or equal to approximately 0.5 micrometer.

In some embodiments, the minimum dimension of conductive pattern elements can be between 0.5 and 50 micrometers, in other embodiments between 0.5 and 25 micrometers, in other embodiments between 1 and 10 micrometers, in other embodiments between 1 and 5 micrometers, in other embodiments between 1 and 4 micrometers, in other embodiments between 1 and 3 micrometers, in other embodiments between 0.5 and 3 micrometers, and in other embodiments between 0.5 and 2 micrometers. With respect to the reproducible achievement of useful optical properties (e.g. high transmission and invisibility of conductive pattern elements with the naked eye) and electrical properties, and in light of the constraint of using practical manufacturing methods, typical values of minimum dimension of conductive pattern elements can be between 0.5 and 5 micrometers, between 1 and 4 micrometers, and even between 1 and 3 micrometers.

In general, the deposited electrically-conductive material can undesirably reduce the light transmission of the touch sensor. Basically, wherever there is electrically conductive material deposited, the display can be shadowed in terms of its viewability by a user. The degree of attenuation caused by the conductor material can be proportional to the area fraction of the sensor or region of the sensor that is covered by conductor, within the conductor micropattern.

In general, it can be desirable for a transparent touch screen sensor to exhibit a low value of haze. Haze refers to a property related to the scattering of light as it passes through a medium, e.g. as measured by a Haze-Gard instrument (Haze-Gard plus, BYK Gardner, Columbia, Md.). In some embodiments, the touch screen sensor can exhibit haze less than 10%, in some embodiments less than 5%, in some embodiments less than 4%, in some embodiments less than 3%, in some embodiments less than 2%. Embodiments are disclosed which can achieve a desirable combination of high transmission (also referred to as visible light transmittance), low haze, and low conductor trace visibility for regions including conductor micropatterns. The conductor micropatterns can be especially useful when used as part of a sensing area or region of a touch screen sensor display, e.g. when the micropattern overlays a viewable region of the display.

In some embodiments, in order to generate a visible light transparent display sensor that has uniform light transmission across the viewable display field, even if there is a non-uniform distribution of sheet resistance, e.g. derived from a non-uniform mesh of conductive material, the sensors can include isolated conductor deposits added to the conductor micropattern that serve to maintain the uniformity of light transmittance across the pattern. Such isolated conductor deposits are not connected to the drive device (e.g., electrical circuit or computer) for the sensor and thus do not serve an electrical function. For example, a metal conductor micropattern that includes a first region with a mesh of square grid geometry of 3 micrometer line width and 200 micrometer pitch (3% of the area is shadowed by the metal, i.e., 97% open area) and second region with a mesh of square grid geometry of 3 micrometer line width and 300 micrometer pitch (2% of the area is shadowed by the metal, i.e., 98% open area) can be made optically uniform in its average light transmission across the two regions by including within each of the open cells of the 300 micrometer pitch grid region one hundred evenly spaced 3 micrometer by 3 micrometer squares of metal conductor in the pattern. The one hundred 3 micrometer by 3 micrometer squares (900 square micrometers) shadow an additional 1 percent of the area for each 300 micrometer by 300 micrometer cell (90000 square micrometers), thus making the average light transmission of the second region equal to that of the first region. Similar isolated metal features can be added in regions of space between contiguous transparent conductive regions, e.g. contiguous transparent conductive regions that include micropatterned conductors in the form of two dimensional meshes or networks, in order to maintain uniformity of light transmittance across the sensor, including the transparent conductive regions and the region of space between them. In addition to isolated squares of conductor, other useful isolated deposits of conductor for tailoring optical uniformity include circles and lines. The minimum dimension of the electrically isolated deposits (e.g., the edge length of a square feature, the diameter of a circular feature, or the width of a linear feature) can be less than 10 micrometers, less than 5 micrometers, less than 2 micrometers, or even less than 1 micrometer.

With respect to the reproducible achievement of useful optical properties (e.g. high transmission and invisibility of conductive pattern elements), using practical manufacturing methods, the minimum dimension of the electrically isolated deposits typically can be between 0.5 and 10 micrometers, between 0.5 and 5 micrometers, between 0.5 and 4 micrometers, between 1 and 4 micrometers, and even between 1 and 3 micrometers. In some embodiments, the arrangement of electrically isolated conductor deposits can be designed to lack periodicity. A lack of periodicity can be typical for limiting unfavorable visible interactions with the periodic pixel pattern of an underlying display. For an ensemble of electrically isolated conductor deposits to lack periodicity, there need only be a single disruption to the otherwise periodic placement of at least a portion of the deposits, across a region having the deposits and lacking micropattern elements that are connected to decoding or signal generation and/or processing electronics. Such electrically isolated conductor deposits are said to have an aperiodic arrangement, or are said to be an aperiodic arrangement of electrically isolated conductor deposits. In some embodiments, the electrically-isolated conductor deposits can be designed to lack straight, parallel edges spaced closer than 10 micrometers apart, e.g. as would exist for opposing faces of a square deposit with edge length of 5 micrometers. The isolated conductor deposits can be designed to lack straight, parallel edges spaced closer than 5 micrometers apart, 4 micrometers apart, preferably 3 micrometers apart, or even 2 micrometers apart. Examples of electrically-isolated conductor deposits that lack straight, parallel edges are ellipses, circles, pentagons, heptagons, and triangles. The absence within the design of electrically-isolated conductor deposits of straight, parallel edges can serve to minimize light-diffractive artifacts that could disrupt the viewability of a display that integrates the sensor.

The impact of the conductor micropattern on optical uniformity can be quantified. For example, if the total area of the sensor, and hence the conductor micropattern, that overlays a viewable region of the display segmented into an array of 1 millimeter by 1 millimeter regions, typical sensors include conductor micropatterns wherein none of the regions have a shadowed area fraction that differs by greater than 75 percent from the average for all of the regions. Typically, none have a shadowed area fraction that differs by greater than 50 percent. Typically, none have a shadowed area fraction that differs by greater than 25 percent. Also, typically, none have a shadowed area fraction that differs by greater than 10 percent. If the total area of the sensor, and hence the conductor micropattern, that overlays a viewable region of the display is segmented into an array of 5 millimeter by 5 millimeter regions, typical sensors can include conductor micropatterns wherein none of the regions have a shadowed area fraction that differs by greater than 50 percent from the average for all of the regions. Typically, none have a shadowed area fraction that differs by greater than 50 percent. Also, typically, none have a shadowed area fraction that differs by greater than 25 percent. Even more typically, none have a shadowed area fraction that differs by greater than 10 percent.

Examples of useful metals for forming the sensing pattern of conductive traces include gold, silver, palladium, platinum, aluminum, copper, nickel, tin, alloys, and combinations thereof. In some embodiments, the conductor is a transparent conducting oxide. The conductor may have a thickness between 5 nanometers and 5 micrometers, or between 10 nanometers and 500 nanometers, or between 15 nanometers and 250 nanometers. In many embodiments, the thickness of the conductor is less than one micrometer. A desired thickness for the conductor can be calculated by starting with the desired sheet resistance and considering the sensing pattern geometry (and in turn its effect on the current-carrying cross-section in the plane) and the bulk resistivity of the conductor, as is known in the art. For complicated geometries of sensing patterns, there are computational methods in the art, e.g. finite difference methods or finite element methods that can be used to calculate sheet resistance, referred to herein as modeling the properties of a sensing pattern. Sheet resistance can be measured using a number of techniques, including four-point probe techniques and non-contact eddy-current methods, as are known in the art.

Sensing patterns of conducting traces for provided capacitive sensors can be generated by any appropriate patterning method, e.g. methods that include photolithography with etching or photolithography with plating (see, e.g., U.S. Pat. No. 5,126,007 (Smulovich); U.S. Pat. No. 5,492,611 (Sugama et al.); U.S. Pat. No. 5,512,131 (Kumar et al.); and U.S. Pat. No. 6,775,907 (Boyko et al.)). Additionally, the conductor patterns can be created utilizing other exemplary methods such as laser cured masking (curing of a mask layer on a metal film, and then etching); inkjet printing (of masking material or of seed material for subsequent metal plating); gravure printing (of a seed material for subsequent metal plating); micro-replication (form micro-grooves in a substrate, then fill with conductive material or with a seed material for subsequent metal plating); or, micro-contact printing (stamping or rotary printing of self-assembled monolayer (SAM) patterns on a substrate's surface). Utilizing high volume, high resolution printing methods generally allow for precision placement of the conductive elements, and also allows for the (pseudo-random) variation of the conductive traces at a scale compatible with commercially available display pixels, to limit optical anomalies (for example moiré patterns) that might otherwise occur.

Certain embodiments discussed herein may employ flat-sided "wire-like" conductors that enable greater light transmission than existing sensors that utilize transparent conductors. These flat-sided "wire-like" conductors, in some embodiments, provide greater scalability and control of conductor placement than is possible with existing round wire solutions. Micro-conductors discussed herein include conductors with maximum cross sectional dimension of 10 micrometers or less. Less than 3 micrometers is typical for many sensor applications. Methods of utilizing masking and etching typically produce a low-aspect (0.05 to 0.5 μm thick×1 μm to 10 μm wide) micro-conductor. Micro-replicated grooves can produce higher aspect ratio micro-conductors, up to greater than 1:1.

Laser cured masking can be used to create patterns of conductive traces by selectively curing a pattern with an ultraviolet laser. Such a process typically works with either film—(for example, PET) or glass-based substrates. A laser cured masking process is exemplified by plating a substrate with metal (for example, silver or copper is sputter coated onto glass or PET film); uniformly coating a UV curable masking ink onto the plated substrate, (for example, spin coating, and dip coating); curing a portion of the printed ink with a laser to form conductive traces in the active area of the touch sensor, and may also cure (wider) lines that interconnect electrodes to connector pads (beam width of the laser may be reduced by a photo mask); removing uncured ink; and removing plated metal from the substrate by etching except for the pattern under the masking ink.

Inkjet printing and plating of seed ink can be used to create patterns of microconductive traces by printing of a desired pattern using relatively wide lines of seed ink (catalytic ink), followed by selective curing with a UV laser, and similar to the laser cured masking process described above. The substrate for this process may be either film—(for example, PET) or glass. The inkjet printing process minimizes the amount of ink used and thus is useful when the inks are expensive (for example, seed inks). If the ink has relatively low cost, inkjet printing can be replaced by another process such as, for example, spin coating or dip coating that coats the whole substrate uniformly.

Gravure printing requires that the image to be printed is "etched" into a metal plate which rotates on a drum. As the drum turns, the etched surface is filled with ink which then gets deposited on the surface of the film being printed as the ink-filled etched plate and the film contact each other. Seed inks (or catalytic inks) may be printed by any of the methods described above. After printing and curing, the inks can be electroless plated with metals such as copper, resulting in high conductivity. Seed ink manufacturers include Conductive Inkjet Technology, a division of Carclo, located in Cambridge, UK and QinetiQ Company in Farnborough, England. Cabot Printable Electronics and Displays of Albuquerque, N. Mex. make inkjet printable silver conductive inks.

Micro-replication is yet another process that can be used to form a pattern of conductive traces. Micro-replicated channels can be filled with seed ink and then plated to make them conductive. Alternatively, the channels could be filled with an ink that by itself is conductive, eliminating the need for the plating process. A third alternative is to coat the substrate with a metal, then mask the portions of metal in the (bottom of) the grooves, then etch away the unmasked metal, (see, for example, PCT Pat. Publ. Nos. WO 2010/002679 (Stay et al.) and WO 2010/002519 (Moran et al.)). The actual shape of the channels can be altered to optimize the cross sectional shape and size that provides the lowest level of optical interference while still ensuring high conductivity and high production yields.

Filled micro-replicated channels can provide a conductor with a high aspect ratio cross section (relative to masked metal films). Thus maximum conductivity may be achieved with minimum optical visibility, (narrow cross section in the direction of viewing). A method of filling micro-replicated channels and desirable shapes of channels with high aspect ratio is described in co-assigned U.S. Pat. Publ. No. 2007/0160811 (Gaides et al.).

Micro-contact printing is yet another process that can be used to form patterns of conductive traces. Micro-contact printing is the stamping or rotary printing of self-assembled monolayer (SAM) patterns on substrate surfaces. The approach exhibits several technologically important features, including the ability to be carried out for very fine scale patterns (e.g., feature size of one tenth of a micrometer) and with the extension of the patterned monolayer to the patterning of metals, ceramics, and polymers. In an exemplary micro-contact printing process a substrate is coated with metal, (for example, silver or copper is sputter coated or plated onto glass or PET film); a self-assembled mono-layer mask is stamped onto the plated substrate; and, metal coated on the substrate is removed by etching, except for the pattern under the mask. As is known in the art, micro-contact printing can be combined with metal deposition processes to yield an additive patterning process (for example, including electroless plating).

Typically, the integrated passive circuit elements can be fabricated using a printing process. They can be fabricated using a micro-contact printing process. Micro-contact printing is the patterned transfer of a self-assembled monolayer (SAM) to a substrate with a relief-patterned elastomeric stamp. The SAM can be transferred to the substrate according to the pattern of high relief for the stamp. Micro-contact printed SAM's on thin film metals can be used as etch resists. High-resolution patterning of the thin film metallic conductor can be possible, for example with feature sizes (e.g., trace width) of one micron or smaller. Subtractive patterning of thin film metals by micro-contact printing followed by etching is described in U.S. Pat. No. 5,512,131 (Kumar et al.).

Transparent or invisible touch-sensing elements (e.g., for a touch display) based on very fine-scale conductor micropatterns and the passive circuit elements described herein can be fabricated simultaneously by a micro-contact printing plus etching process. Transparent or invisible touch-sensing elements (e.g., for a touch display) based on very fine-scale conductor micropatterns are described, for example, in U.S. Pat. Publ. No. 2009/219257 (Frey et al.). The fabrication of transparent or invisible touch-sensing elements using a micro-contact printing process is described, for example, in U.S. Pat. Publ. No. 2009/0218310 (Zu et al.). The conductors, substrates, and process details described in the aforementioned publications may be used to construct capacitive sensors having integrated passive circuit elements according to the present disclosure. In some embodiments, transparent or invisible touch-sensing elements (e.g., for a touch display) based on very fine-scale conductor micropatterns (e.g., metallic mesh micropatterns), the passive circuit elements described herein, and interconnect features (e.g., signal routing traces and contact pads) can be fabricated simultaneously from the same conductive material, preferably in a single conductive material patterning cycle. By single patterning cycle, what is meant is a series of steps that yield a first pattern of conductive material. An example of a single conductive material patterning cycle is: a) deposition of a conductive material coating across an area of a major surface of a planar insulating substrate (e.g., polymer film); b) micro-contact printing of a self-assembled monolayer (SAM) pattern mask on the surface of the conductive material coating, yielding SAM-coated regions of conductive material coating and exposed regions of conductive material coating; c) removal of the conductive material coating from the exposed regions by wet chemical etching, without removal of the conductive material coating from the SAM-coated regions. Another example of a single conductive material patterning cycle is: a) deposition of a conductive material coating across an area of a major surface of a planar insulating substrate (e.g., polymer film); b) deposition of a coating of photoresist on the conductive material coating (e.g., by spray coating, dip-coating, spin-coating, or die-coating); c) exposure of the photoresist to a pattern of light through a photomask; d) development of the photoresist, yielding photoresist-coated regions of the conductive material coating and exposed regions of the conductive material coating; e) removal of the conductive material from the exposed regions by wet chemical etching, without removal of the conductive material from the photoresist-coated regions. Another example of a single conductive material patterning cycle is offset gravure printing of a conductive material ink, for example a metal nanoparticle ink (e.g. a silver nanoparticle ink) followed by thermal treatment (e.g. oven heating or infrared lamp exposure). Examples of interconnect features in the form of signal routing traces include linear conductive pattern elements that lead from contact pads suitable for attachment of a flexible circuit tail to transparent or invisible touch-sensing elements (e.g., for a touch display) based on very fine-scale conductor micropatterns. The signal routing traces can be between 5 microns and 250 microns in width, preferably between 7.5 microns and 100 microns, more preferably between 10 microns and 50 microns, most preferably between 15 microns and 25 microns.

The provided capacitive sensor has a first passive circuit element that includes a metallic conductor disposed (integrated) on the same surface of the substrate as the sensing pattern of conductive traces. Passive circuit elements consist of resistors (R), capacitors (C), and inductors (L). Passive circuit elements can be combined in various ways to filter or change an electronic signal passing through the circuit.

Figure 2:
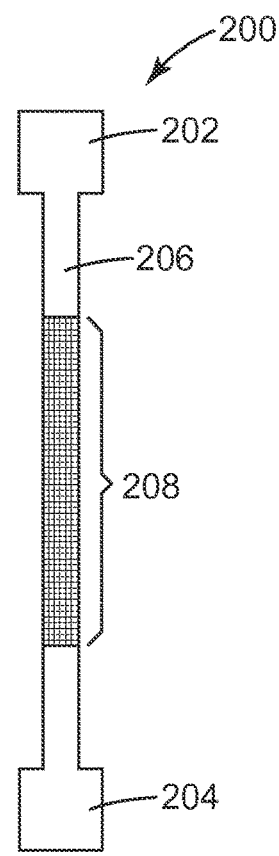
FIG. 2 is a schematic diagram of a resistor element useful in the provided capacitive sensor.

FIG. 2 is a schematic illustration of an embodiment of a resistor (R) element that can be fabricated from a metallic conductor using a micro-contact printing process as disclosed above. Resistor element 200 includes two electrodes (ends) 202 and 204. These electrodes can be large enough to connect to other elements in an electronic circuit when the resistor is incorporated into such a circuit. Attached to each electrode 202 and 204 is a solid conductive portion 206 that acts as an electrical connector from each electrode to either sides of resistive mesh element 208. Mesh element 208 of thin film metal may be designed to yield a predictable resistance value. For example, a copper mesh element comprising six 2 micron diameter×500 micron long conductive traces with 10 microns between each trace can provide resistance of about 13 ohms. By varying the dimensions and thicknesses of mesh elements, resistors have resistance values of from about 10 to about 10 k ohms, or from about 25 to about 5 k ohms can be created.

Figure 3A:
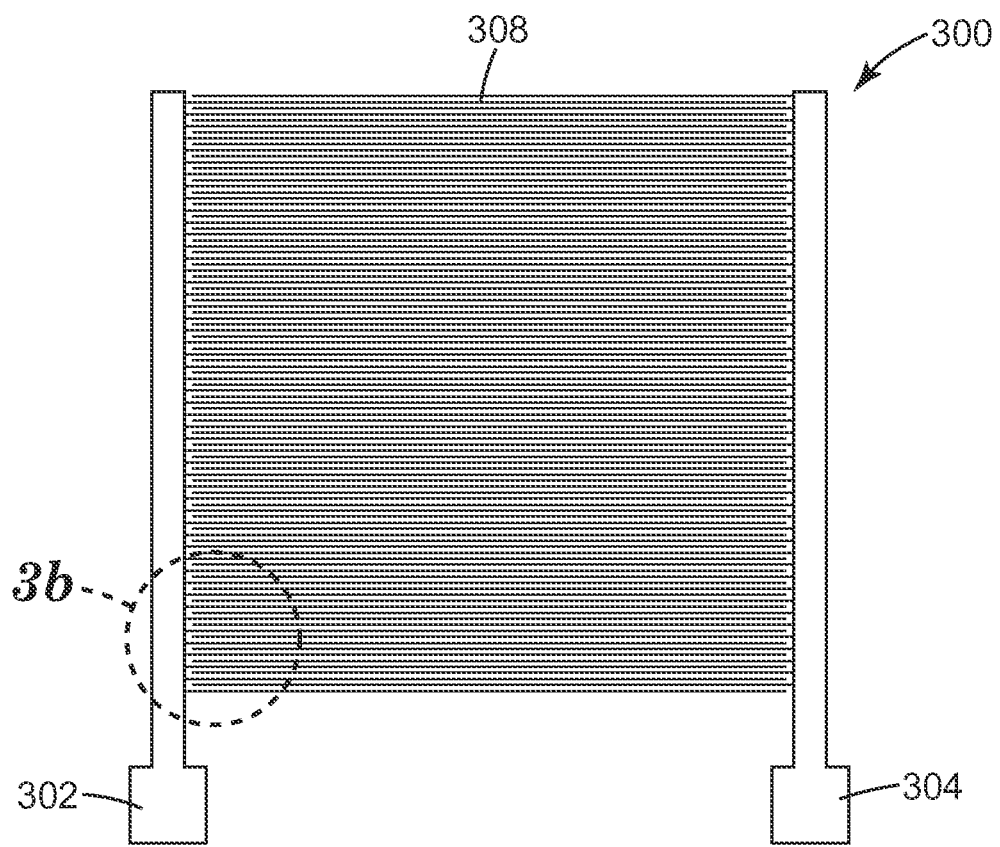
FIG. 3a is a schematic diagram of a capacitive element useful in the provided capacitive sensor.
Figure 3B:
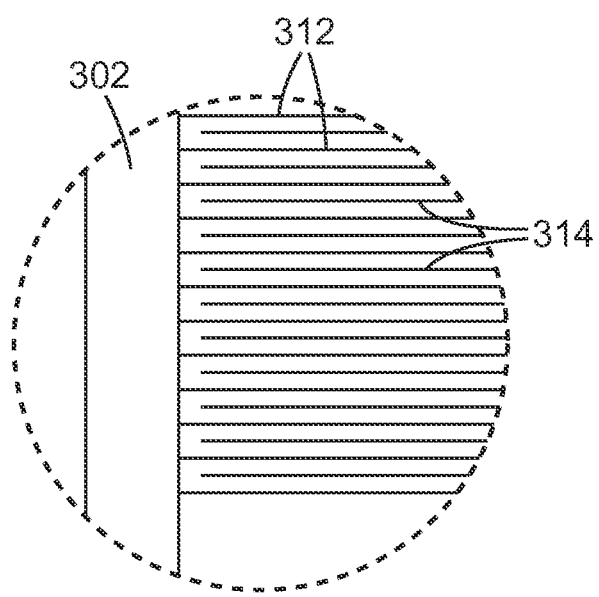

FIG. 3a is a schematic diagram of a capacitive element that can be useful in an embodiment of a provided capacitive sensor. Capacitive element 300 is a planar or interdigitated capacitor. Terminals 302 and 302 are connected to comb-like conductive elements 308 that are not connected electrically, but rather are interdigitated. FIG. 3b is an exploded view of a portion of capacitive element 300. FIG. 3b shows terminal 302 that has comb elements 312 projecting from it towards terminal 304 (not shown in exploded view). FIG. 3b also shows comb elements 314 located between, but not touching, comb elements 312. Comb elements 314 are connected to terminal 304. The interdigitated geometry provides a significant amount of charge storage capacity. For example, if the capacitive element illustrated in FIG. 3a has 5 micron conductive traces and 5 micron spaces between the traces then, if the area of the capacitor is 1 mm$^2$ the capacitor can have capacitance values of from about 1.5 to about 2.0 picofarads. If the area of the capacitor is 1 cm$^2$ the capacitor can have capacitance values of from about 150 to about 200 picofarads. Typical capacitive values range from about 0.25 to about 250 picofarads or from about 1 to about 200 picofarads. In some embodiments, the traces making up the comb elements of the interdigitated capacitor are between 2 microns and 25 microns, preferably between 3 microns and 20 microns, more preferably between 5 and 15 microns. As an alternative to the above-described interdigitated capacitor, some integrated capacitors of the present disclosure are parallel plate capacitors. The parallel plate capacitor includes a lower electrode, a dielectric layer, and an upper electrode. Examples of useful dielectrics include printable polymers, sol-gel metal oxides, and anodic oxides. Examples of useful dielectric thicknesses include thicknesses between 0.05 microns and 20 microns, preferably between 0.1 and 10 microns, most preferably between 0.25 and 5 microns.

Figure 4:
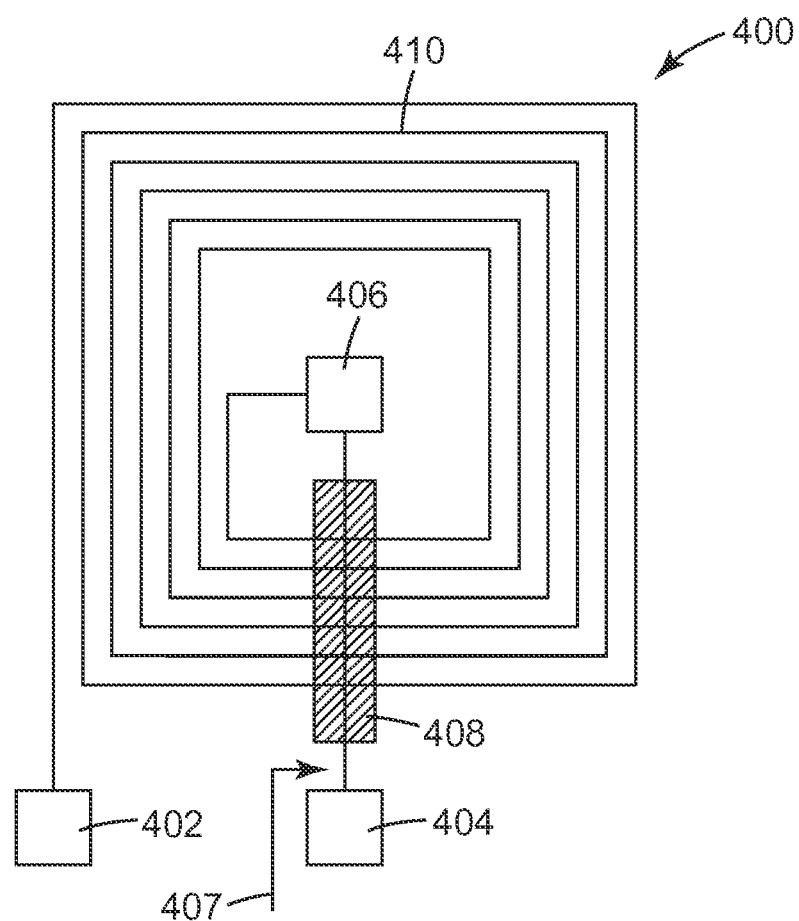
FIG. 4 is a schematic diagram of an inductive element useful in the provided capacitive sensor.

FIG. 4 is a schematic illustration of an inductive element that can be useful in an embodiment of a provided capacitive sensor. Inductor 400 includes outer electrode 402 and inner electrode 406. Conductive trace 410 connects outer electrode 402 and inner electrode 406 and follows a substantially spiral path as shown. Dielectric 408 is disposed over conductive trace 410 as shown to allow for conductive jumper trace 407 to connect inner electrode 406 to outer electrode 404 for ease of connection when inductor 400 is incorporated into a circuit. Dielectric 408 isolates conductive jumper trace 407 from conductive trace 410.

A simple equation for determining the inductance of a spiral inductor is $$L = \mu_o n^2 r = 1.2 \times 10^{-6} n^2 r$$

where n is the number of turns and r is the radius. The radius used is measured to the middle of the coils. As an example, using n=6 and r=180 microns, L is calculated to be about 0.008 microhenrys (µH). Placing more coils in similar space would increase the inductor value. For example, starting at an inner radius of 100 microns and then using 5 micron wire and 5 micron spaces, 25 turns would yield an inductor with a value of about 0.181 pH.

Figure 5:
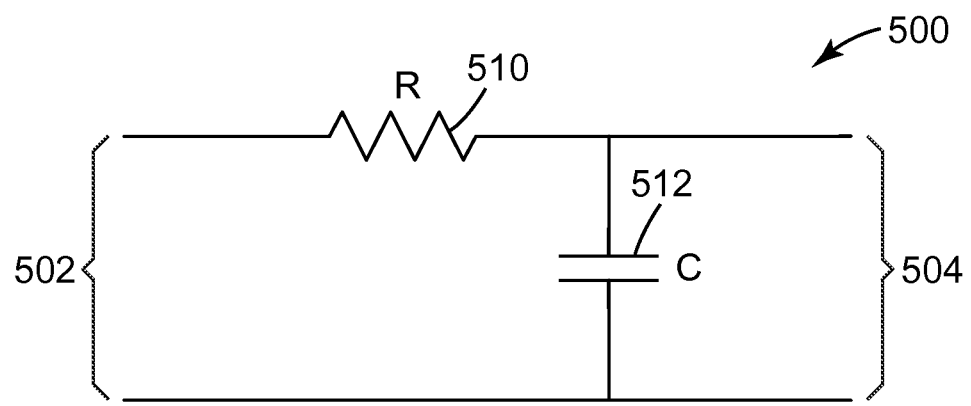
FIG. 5 is a circuit diagram of an RC low pass filter.
Figure 6:
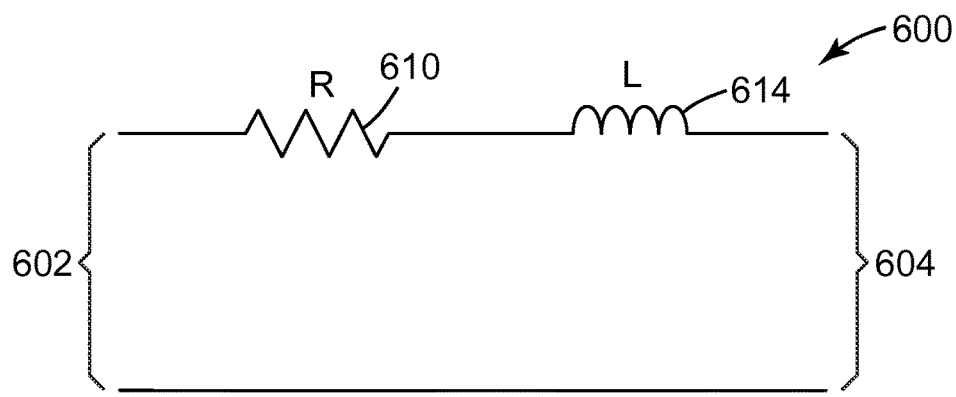
FIG. 6 is a circuit diagram of an RL low pass filter.
Figure 7:
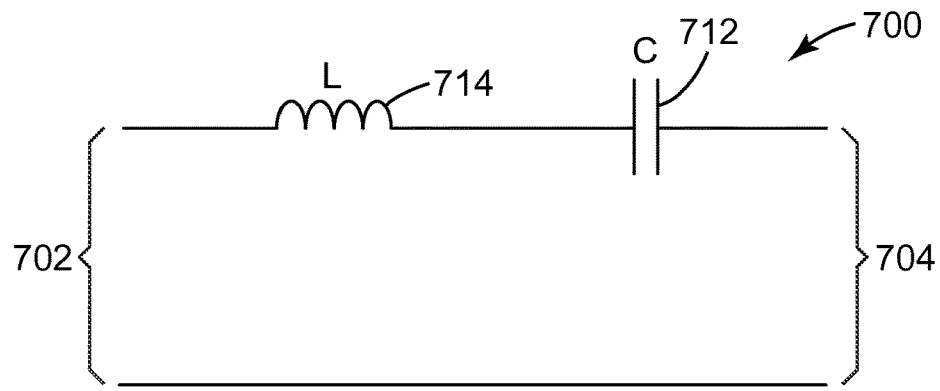
FIG. 7 is a circuit diagram of an LC low pass filter.

FIGS. 5 to 7 are circuit diagrams for simple low pass filters that can be made using combinations of resistive, capacitive, and inductive elements such as those just described. FIG. 5 is a diagram of an RC low pass filter. Filter 500 takes electronic signal input 502 through series resistive element 510 with parallel capacitive element 512 to yield filtered signal output 504. The cut-off frequency of the low pass filter can be determined by the resistance and capacitance values of resistive element 510 and capacitive element 512.

In a similar manner, FIG. 6 is a diagram of an RL low pass filter. Filter 600 takes electronic signal input 602 through series resistive element 610 and series inductive element 614 to yield filtered signal output 604. The cut-off frequency of the low pass filter can be determined by the resistance and inductance values of resistive element 610 and inductive element 614.

FIG. 7 is a diagram of an LC band pass filter. Filter 700 takes electronic signal input 702 through series capacitive element 712 and series inductive element 714 to yield filtered signal output 704. The pass band frequencies of the low pass filter can be determined by the (near, in the vicinity of, or within the electrical field of) touching capacitance and inductance values of capacitive element 712 and inductive element 714.

Figure 8:
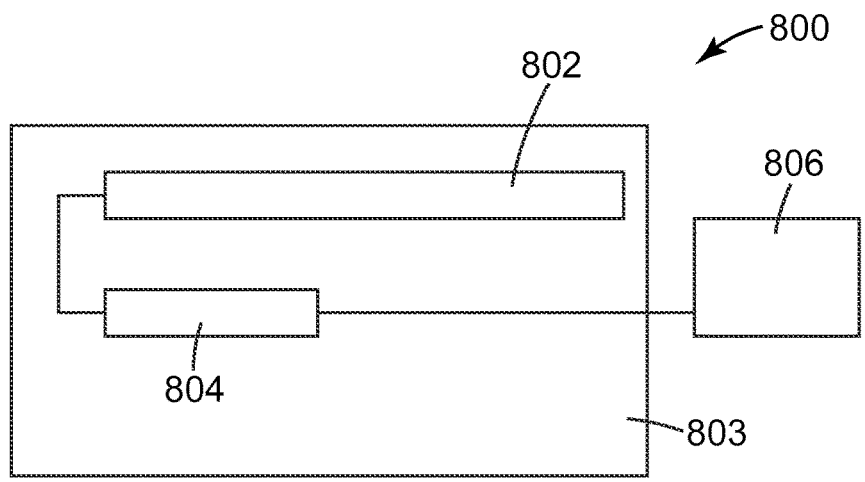
FIG. 8 is a schematic illustration of an embodiment of a provided capacitive sensor.

FIG. 8 is a schematic illustration of an embodiment of a provided capacitive sensor. FIG. 8 shows capacitive sensor 800. Sensor 800 includes substrate 803 having a surface. Sensing pattern of conductive traces 802 is disposed upon the surface of the substrate along with low pass filter 804. Low pass filter 804 includes at least a first passive circuit element disposed upon the surface of the substrate as shown. In the embodiment shown in FIG. 8 detection electronics 806 are not located on substrate 803.

This disclosure further relates to contact or proximity sensors for touch input of information or instructions into electronic devices (e.g., computers, cellular telephones, etc.) These sensors are visible light transparent and useful in direct combination with a display, overlaying a display element, and interfaced with a device that drives the display (as a "touch screen" sensor). The sensor element can have a sheet like form and can include at least one electrically insulating visible light transparent substrate layer that supports one or more of the following: i) conductive material (e.g., metal) that is mesh patterned onto two different regions of the substrate surface with two different mesh designs so as to generate two regions with different effective sheet resistance values, where at least one of the regions is a transparent conductive region that lies within the touch-sensing area of the sensor; ii) conductive material (e.g., metal) that is patterned onto the surface of the substrate in a mesh geometry so as to generate a transparent conductive region that lies within the touch-sensing area of the sensor and that exhibits anisotropic effective sheet resistance; and/or iii) conductive material (e.g., metal) that is patterned onto the surface of the substrate in a mesh geometry within an effectively electrically continuous transparent conductive region, the geometry varying within the region so as to generate different values of local effective sheet resistance in at least one direction (e.g., continuously varying sheet resistance for the transparent conductive region), where the region lies within the sensing area of the touch sensor.

The sensing area of a touch sensor is that region of the sensor that is intended to overlay, or that overlays, a viewable portion of an information display and is visible light transparent in order to allow viewability of the information display. Viewable portion of the information display refers to that portion of an information display that has changeable information content, e.g. the portion of a display "screen" that is occupied by pixels, e.g. the pixels of a liquid crystal display. Examples of useful displays with which sensors of the invention can be integrated include liquid crystal displays, cathode ray tube displays, plasma display panels, and organic light emitting diode displays.

In another aspect, a method of making a capacitive sensor in provided that includes providing a substrate comprising a metal coating disposed thereon. The substrate and the metal coating components have been described above. The method further includes etching the metal to form a sensing pattern of conductive metal traces disposed upon to the substrate. At least one passive circuit element that includes a metallic conductor is disposed upon the same surface of the substrate. The provided method can further include contacting the raised features of an inked stamp to the metal coating before etching the metal coating. The inked stamp can include a self-assembled monolayer-forming molecule.

Objects and advantages of this invention are further illustrated by the following examples, but the particular materials and amounts thereof recited in these examples, as well as other conditions and details, should not be construed to unduly limit this invention.

EXAMPLES

Passive circuit elements were integrated onto transparent polymer film substrates using micro-contact printing and etching.

Examples 1-7

Integrated Resistors

Resistor elements were integrated onto polyethylene terephthalate (PET, MELINEX ST504 film, available from E. I. du Pont de Nemours, Wilmington, Del.) film substrates by i)

coating the PET substrate with a thin film of metal (3 nanometers of chromium adhesion layer, followed by 100 nanometers of silver) by thermal evaporation; ii) microcontact printing (10 seconds) a pattern of alkylthiol (n-octadecanethiol, available from TCI America, Portland, Oreg.) self-assembled monolayer onto the silver surface; wet chemically etching the metal in order to yield an integrated resistor in the pattern of the printed self-assembled monolayer. The wet chemical etchant was an aqueous solution of 20 mM ferric nitrate (Aldrich Chemical Company, Milwaukee, Wis.) and 30 mM thiourea (Aldrich Chemical Company, Milwaukee, Wis.).

The printing stamp was molded from polydimethylsiloxane (PDMS, SYLGARD 184, Dow Corning, Midland, Mich.) using a master comprising a pattern of photoresist on a silicon wafer, fabricated using standard techniques. The stamp included a relief pattern of raised features in the desired patterns of multiple resistors. The stamp was inked by contacting with an ethanolic solution (10 mM) of the alkylthiol for 17.5 h prior to printing.

Referring to FIG. 2, each resistor included two electrodes (ends) and a resistive mesh element. The resistive mesh element in each case measured approximately 30 millimeters in length between the electrodes and approximately 1 millimeter in width. For each of Examples 1-7, the resistive mesh element was fabricated with a different design. All of the resistive mesh elements of Examples 1-7 were comprised of conductive metallic traces arranged in the form of square grids, but the square grids had different dimensions. More specifically, the square grids varied in terms of their nominal trace width and their nominal open aperture. Open aperture refers to the area fraction within the resistive mesh element region that is not covered with metal. Table 1 gives the nominal trace width and the nominal open aperture for the integrated resistors of Examples 1-7, along with the actual resistance that was measured for each, after fabrication.

TABLE 1

Measured Resistance of Integrated Resistors

| Example No. | Nominal Trace Width (microns) | Nominal Open Aperture (%) | Measured Resistance (ohms) |
| --- | --- | --- | --- |
| 1 | 3 | 90 | 173 |
| 2 | 5 | 90 | 194 |
| 3 | 3 | 93 | 252 |
| 4 | 3 | 95 | 365 |
| 5 | 5 | 95 | 350 |
| 6 | 3 | 97 | 654 |
| 7 | 5 | 97 | 535 |

Examples 8-13

Integrated Capacitors

Capacitor elements were integrated onto polyethylene terephthalate (PET, MELINEX ST504, available from E. I. du Pont de Nemours, Wilmington, Del.) film substrates by i) coating the PET substrate with a thin film of metal (3 nanometers of chromium adhesion layer, followed by 70 nanometers of gold) by thermal evaporation; ii) microcontact printing (10 seconds) a pattern of alkylthiol (n-octadecanethiol, available from TCI America, Portland, Oreg.; or n-eicosanethiol, available from Robinson Brothers, West Bromwich, West Midlands, United Kingdom) self-assembled monolayer onto the gold surface; wet chemically etching the metal in order to yield an integrated capacitor in the pattern of the printed self-assembled monolayer. The wet chemical etchant was an aqueous solution of approximately 5 volume percent of 6N hydrochloric acid in water, approximately 5 volume percent of an aqueous 15 wt % hydrogen peroxide solution, and approximately 90 volume percent of a 5 wt % solution of thiourea in water (all reagents commercially available from Aldrich Chemical Company, Milwaukee, Wis.).

The printing stamp was molded from polydimethylsiloxane (PDMS, SYLGARD 184, available from Dow Corning, Midland, Mich.) using a master comprising a pattern of photoresist, fabricated using standard techniques. The stamp included a relief pattern of raised features in the desired patterns of multiple capacitors. The stamp was inked by contacting with an ethanolic solution of the alkylthiol (10 mM for n-octadecanethiol; 5 mM for n-eicosanethiol) prior to printing. n-eicosanethiol was used for Example 13. Referring to FIG. 3, each capacitor included two terminals connected to interdigitated comb-like conductor elements. The interdigitated capacitor in each case included the comb-like elements covering an interdigitated capacitor area in the form of a square. For each of Examples 8-13, the capacitor element was fabricated with a different design. All of the capacitor elements of Examples 8-13 were comprised of conductive metallic traces arranged in the form of interdigitated comb-like elements, but the capacitors had different combinations of area, comb element trace width and comb element pitch. Table 2 gives the nominal comb element trace width, the nominal comb element pitch, and the capacitor area for the integrated capacitors of Examples 8-13, along with the actual capacitance that was measured for each, after fabrication.

TABLE 2

Capacitance of Interdigitated Capacitors

| Example No. | Comb Element Trace Width (microns) | Comb Element Pitch (microns) | Interdigitated Capacitor Area | Measured Capacitance (pF) |
| --- | --- | --- | --- | --- |
| 8 | 20 | 40 | 1 cm × 1 cm | 40-50 |
| 9 | 20 | 40 | 2 cm × 2 cm | 145-192 |
| 10 | 10 | 20 | 1 cm × 1 cm | 72-95 |
| 11 | 10 | 20 | 2 cm × 2 cm | 325 |
| 12 | 5 | 10 | 1 cm × 1 cm | 150-200 |
| 13 | 2.5 | 5 | 1 cm × 1 cm | 151 |

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows. All references cited in this disclosure are herein incorporated by reference in their entirety.

What is claimed is:

1. A capacitive sensor comprising:
   a substrate having a surface;
   a touch-sensing pattern of metallic conductive traces disposed on the surface of the substrate; and a first passive circuit element comprising an interdigitated capacitor comprising metal traces disposed on the surface of the substrate to reduce an effect of electromagnetic interference on a sensing performance of the capacitive sensor, wherein a thickness of the touch-sensing pattern of metallic conductive traces is substantially the same as a thickness of the first passive circuit element.

2. A capacitive sensor according to claim 1, wherein the substrate comprises a visible light transparent substrate.

3. A capacitive sensor according to claim 1, wherein the substrate comprises a transparent polymer.

4. A capacitive sensor according to claim 1, wherein the touch-sensing pattern of metallic conductive traces and the first passive circuit element comprise the same material.

5. A capacitive sensor according to claim 1, wherein the first passive circuit element further comprises a resistor or an inductor comprising metal traces.

6. A capacitive sensor according to claim 5, wherein the resistor comprises a mesh of metallic traces.

7. A capacitive sensor according to claim 6, wherein the mesh comprises metallic traces having a width of less than about 2 microns.

8. A capacitive sensor according to claim 5, wherein the resistor has a resistance of from about 1 ohm to about 1,000 ohms.

9. A capacitive sensor according to claim 1, wherein the interdigitated capacitor has a capacitance value of from about 1 picofarad to about 200 picofarads.

10. A capacitive sensor according to claim 5, wherein the inductor has an inductance value from about 0.01 henry to about 1.00 henry.

11. A capacitive sensor according to claim 1, further comprising one or more additional passive circuit elements comprising metallic conductor disposed upon the surface of the substrate.

12. A capacitive sensor according to claim 11, wherein the one or more additional passive circuit elements form at least a portion of an electronic circuit.

13. A capacitive sensor according to claim 12, wherein the electronic circuit functions as a low-pass filter, a high-pass filter, or a band-pass filter.

14. A capacitive sensor according to claim 13, wherein the low-pass filter substantially filters out high frequencies above about 100 kHz.

15. A capacitive sensor according to claim 1, wherein the metallic conductive traces, the metal traces of the interdigitated capacitor, or both comprise copper, silver, gold, or combinations thereof.

* * * * *

UNITED STATES PATENT AND TRADEMARK OFFICE
CERTIFICATE OF CORRECTION

PATENT NO. : 10,900,766 B2
APPLICATION NO. : 14/569943
DATED : January 26, 2021
INVENTOR(S) : Bill Weaver et al.

Page 1 of 1

It is certified that error appears in the above-identified patent and that said Letters Patent is hereby corrected as shown below:

In the Specification

Column 15
Line 29, delete "pH" and insert -- $\mu H$ --, therefor.

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*